(12) United States Patent
Kamal et al.

(10) Patent No.: US 7,163,860 B1
(45) Date of Patent: Jan. 16, 2007

(54) METHOD OF FORMATION OF GATE STACK SPACER AND CHARGE STORAGE MATERIALS HAVING REDUCED HYDROGEN CONTENT IN CHARGE TRAPPING DIELECTRIC FLASH MEMORY DEVICE

(75) Inventors: Tazrien Kamal, San Jose, CA (US); Yun Wu, Sunnyvale, CA (US); Mark Ramsbey, Sunnyvale, CA (US); Jean Yee-Mei Yang, Sunnyvale, CA (US); Arvind Halliyal, Cupertino, CA (US); Rinji Sugino, San Jose, CA (US); Hidehiko Shiraiwa, San Jose, CA (US); Fred T K Cheung, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 183 days.

(21) Appl. No.: 10/430,471

(22) Filed: May 6, 2003

(51) Int. Cl.
*H01L 21/8247* (2006.01)
(52) U.S. Cl. .................. 438/257; 438/954; 257/E21.18
(58) Field of Classification Search ........ 438/257–267, 438/954; 257/E21.18
See application file for complete search history.

(56) References Cited

U.S. PATENT DOCUMENTS

| | | | | |
|---|---|---|---|---|
| 5,629,892 A | 5/1997 | Tang | ........................ | 365/185.2 |
| 5,976,991 A | 11/1999 | Laxman et al. | ............. | 438/786 |
| 5,989,957 A * | 11/1999 | Ngo et al. | ................... | 438/257 |
| 6,188,604 B1 | 2/2001 | Liu et al. | ............... | 365/185.11 |
| 6,194,784 B1 * | 2/2001 | Parat et al. | .................. | 257/774 |
| 6,222,759 B1 | 4/2001 | Chi-Hung | .............. | 365/185.01 |
| 6,277,200 B1 | 8/2001 | Xia et al. | .................... | 118/697 |
| 6,287,916 B1 * | 9/2001 | Mehta | ........................ | 438/257 |
| 6,297,990 B1 | 10/2001 | Harris et al. | ........... | 365/185.21 |
| 6,406,960 B1 * | 6/2002 | Hopper et al. | .............. | 438/261 |

* cited by examiner

*Primary Examiner*—Richard A. Booth
(74) *Attorney, Agent, or Firm*—Renner, Otto, Boisselle & Sklar, LLP

(57) ABSTRACT

The present invention, in one embodiment, relates to a process for fabricating a charge trapping dielectric flash memory device including steps of providing a semiconductor substrate having formed thereon a gate stack comprising a charge trapping dielectric charge storage layer and a control gate electrode overlying the charge trapping dielectric charge storage layer; forming an oxide layer over at least the gate stack; and depositing a spacer layer over the gate stack, wherein the depositing step deposits a spacer material having a reduced hydrogen content relative to a hydrogen content of a conventional spacer material.

19 Claims, 4 Drawing Sheets

METHOD OF FORMATION OF GATE STACK SPACER AND CHARGE STORAGE MATERIALS HAVING REDUCED HYDROGEN CONTENT IN CHARGE TRAPPING DIELECTRIC FLASH MEMORY DEVICE

TECHNICAL FIELD

The present invention relates to semiconductor devices and the fabrication thereof and, more particularly, to a charge trapping dielectric flash memory device with reduced hydrogen content in gate stack spacer or charge storage materials and a method of formation of the gate stack spacer and charge storage materials.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important charge storage material for EEPROM devices is a charge trapping dielectric, for example silicon nitride in an oxide-nitride-oxide (ONO) structure. One EEPROM device that utilizes a charge trapping dielectric charge storage layer is a silicon-oxide-nitride-oxide-silicon (SONOS) type flash memory cell. In other such devices, like SONOS, the charge storage is in a charge trapping dielectric layer, but the materials of the various layers may vary from those used in SONOS devices. That is, the silicon, oxide or nitride may be replaced with another material. For example, silicon may be replaced by germanium or silicon-germanium, oxide and/or nitride may be replaced by, e.g., a high-K dielectric material. Such devices, as well as the SONOS device, are generally included within the designation "charge trapping dielectric flash memory" device, as used herein.

In charge trapping dielectric flash memory devices, during programming, electrical charge is transferred from the substrate to the charge trapping dielectric charge storage layer, e.g., the nitride (N) layer in an ONO structure. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped in the charge trapping dielectric layer. This jump is known as hot carrier injection (HCI), the hot carriers being electrons. Electrons are trapped near the drain region because the electric fields are the strongest near the drain. Reversing the potentials applied to the source and drain will cause electrons to travel along the channel in the opposite direction and be injected into the charge trapping dielectric layer near the source region. Because the charge trapping dielectric material is not electrically conductive, the charge introduced into the charge trapping dielectric layer tends to remain localized. Accordingly, depending upon the application of voltage potentials, electrical charge can be stored in discrete regions within a single continuous charge trapping dielectric charge storage layer.

Non-volatile memory designers have taken advantage of the localized nature of electron storage within a charge trapping dielectric layer and have designed memory circuits that utilize two or more regions of stored charge within the layer. This type of non-volatile memory device is known as a dual-bit or multi-bit EEPROM, or as a charge trapping dielectric flash memory device. Such a device is available under the trademark MIRRORBIT™ from Advanced Micro Devices, Inc., Sunnyvale, Calif. The MIRRORBIT™ device is capable of storing twice as much information as a conventional EEPROM in a memory array of equal size. A left bit and a right bit are stored in physically different areas of the charge trapping dielectric layer, near the left and right regions of each memory cell. The above-described programming methods are used to enable the two bits to be programmed and read independently. The two bits of the memory cell can be individually erased by applying suitable erase voltages to the gate and to either the source or drain regions.

While the recent advances in charge trapping dielectric flash memory technology have enabled memory designers to double the memory capacity of charge trapping dielectric flash memory arrays using dual-bit data storage, numerous challenges remain in the fabrication of material layers within these devices.

In a charge trapping dielectric flash memory cell, the control gate electrode is separated from the charge trapping dielectric charge storage layer by a top dielectric layer (usually an oxide), and the charge storage layer is separated from the semiconductor substrate (channel region) by a bottom dielectric layer (usually an oxide), forming the oxide-charge trapping dielectric-oxide stack, e.g., the ONO structure. The control gate electrode is isolated from laterally surrounding structures by a gate stack spacer, which conventionally comprises a thin layer (e.g., about 100–150 angstroms) of silicon dioxide and a larger structure of silicon nitride. The conventional gate stack spacer is deposited by PECVD, but this method imparts a significant hydrogen content into the silicon nitride. For example, the conventionally employed PECVD method can impart substantially greater than two atomic percent, e.g., from about 5 to about 30 atomic percent, hydrogen into the silicon nitride of the gate stack spacer. Previously, the hydrogen content in the gate stack spacer has not presented a problem to proper functioning of charge trapping dielectric flash EEPROM memory devices.

However, the present inventors have discovered that hydrogen contained in the gate stack spacer or in the charge storage layer can migrate into the oxide layer and into the bottom or tunnel oxide layer, and can cause problems such as degradation of device properties, including adverse effects on the subthreshold slope or transconductance GM after program/erase as a result of the migration. As device dimensions have steadily decreased, the effect of such hydrogen has become more pronounced, as discovered by the present inventors.

Accordingly, advances in fabrication technology of structures such as the gate sidewall structure mentioned above, are needed to eliminate or reduce problems resulting from hydrogen in the gate stack spacer structure used in charge trapping dielectric flash memory devices.

DISCLOSURE OF THE INVENTION

The present invention, in one embodiment, relates to a process for fabricating a charge trapping dielectric flash memory device including steps of providing a semiconductor substrate having formed thereon a gate stack comprising a charge trapping dielectric charge storage layer and a control gate electrode overlying the charge trapping dielectric charge storage layer; forming an oxide layer over at least the gate stack; and depositing a spacer layer over the gate stack, wherein the depositing step deposits a spacer material having a reduced hydrogen content relative to a hydrogen content of a conventional spacer material.

In another embodiment, the present invention relates to a process for fabricating a charge trapping dielectric flash memory device including providing a semiconductor substrate having formed thereon a bottom oxide layer; depositing on the bottom oxide layer a charge trapping dielectric charge storage layer, wherein the charge storage layer includes a charge trapping dielectric material having a reduced hydrogen content relative to a hydrogen content of a conventional charge trapping dielectric storage layer; depositing on the charge storage layer a top oxide layer; depositing on the top oxide layer a control gate electrode layer, whereby a gate stack comprising the bottom oxide layer, the charge storage layer, the top oxide layer and the control gate electrode is provided; forming an oxide layer over at least the gate stack; depositing a spacer layer over the gate stack, wherein the spacer layer includes a spacer material having a reduced hydrogen content relative to a hydrogen content of a conventional spacer material; and etching the spacer layer to form a gate stack spacer structure adjacent the gate stack, in which hydrogen substantially does not migrate from the gate stack spacer structure into the gate stack, and hydrogen substantially does not migrate from the charge storage layer during subsequent processing or in use.

In another embodiment, the present invention relates to a process for fabricating a charge trapping dielectric flash memory device including steps of providing a semiconductor substrate having formed thereon a gate stack comprising a charge trapping dielectric charge storage layer and a control gate electrode overlying the charge trapping dielectric charge storage layer; forming an oxide layer over at least the gate stack; depositing a spacer layer over the gate stack, in which the depositing step deposits a spacer material having a reduced hydrogen content relative to a hydrogen content of a conventional spacer material; and etching the spacer layer to form a sidewall gate stack spacer structure adjacent the gate stack, in which the spacer material comprises one or more of silicon-rich silicon nitride, silicon oxynitride having an oxygen content greater than about 5 atomic percent, and silicon nitride formed in the presence of oxygen and having an oxygen content less than 5 atomic percent, in which the spacer material comprises a hydrogen content of about 2 atomic percent or less, and the hydrogen content of a conventional spacer material is substantially greater than 2 atomic percent, and in which hydrogen substantially does not migrate from the gate stack spacer into the gate stack during subsequent processing or in use.

Thus, the present invention provides a solution to the problem of hydrogen introduced as an impurity or side product in the formation of gate stack spacers in charge trapping dielectric flash memory devices.

Figure 1:
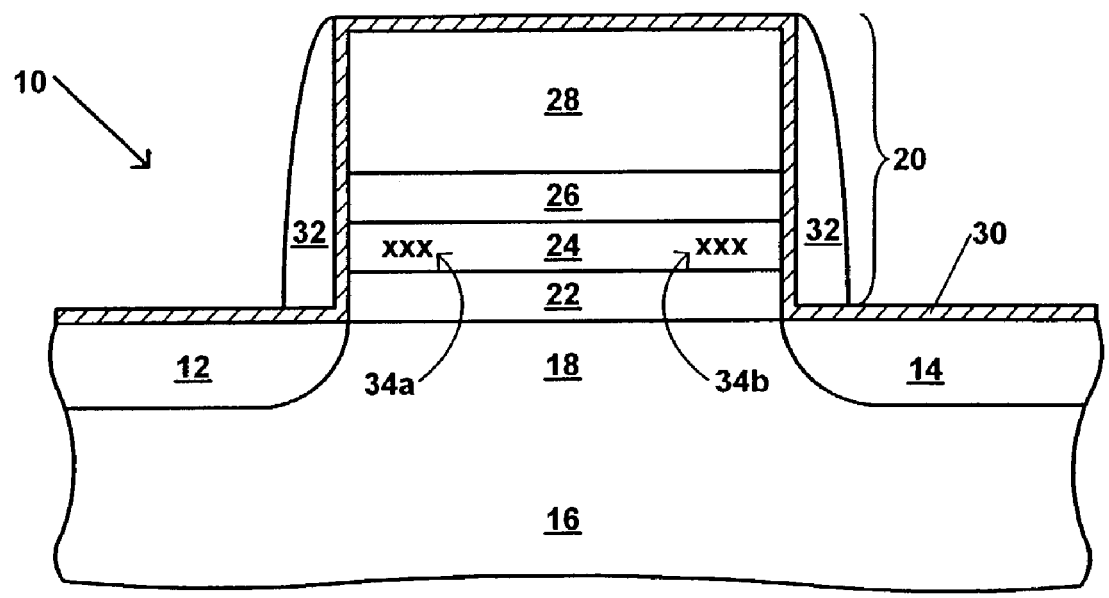
FIG. 1 illustrates a portion of a semiconductor substrate containing a charge trapping dielectric flash memory device including gate stack spacers fabricated in accordance with the invention.

It should be appreciated that for simplicity and clarity of illustration, elements shown in the Figures have not necessarily been drawn to scale. For example, the dimensions of some of the elements may be exaggerated relative to each other for clarity. Further, where considered appropriate, reference numerals have been repeated among the Figures to indicate corresponding elements.

It should be appreciated that the process steps and structures described below do not form a complete process flow for manufacturing a charge trapping dielectric flash memory device. The present invention can be practiced in conjunction with fabrication techniques currently used in the art, and only so much of the commonly practiced process steps are included as are necessary for an understanding of the present invention.

DETAILED DESCRIPTION OF THE INVENTION

It should be appreciated that while the present invention will be described in terms of a charge trapping dielectric flash memory device, the present invention is not limited to such device, and is applicable to a broad range of semiconductor devices and their fabrication processes. Generally speaking the semiconductor devices will include at least one active component therein, for example a diode, transistor, thyristor or the like. Illustrative examples include MOS-based devices such as MOSFET devices, including CMOS and NMOS technology, light-emitting diodes, laser diodes, and the like. In this regard, the MOS-based technology discussed herein is intended to encompass the use of gate conductors other than metals as is commonly practiced, and thus reference to MOS-based devices encompasses other insulated gate technologies (e.g. IGFETs). While aspects of the present invention will now be described in more detail with reference to a charge trapping dielectric flash memory device, it will be understood that the invention is applicable to the above-mentioned and other semiconductor devices which are susceptible to problems resulting from the hydrogen content of elements of which the device is formed.

Turning now to FIG. 1, there is schematically shown in cross-section a transistor 10 suitable for use in a charge trapping dielectric flash memory device, such as the MIR-RORBIT™. The transistor 10 includes source/drain regions 12 and 14 located in a semiconductor substrate 16 and separated by a channel region 18. A gate stack 20 is formed over the channel region 18, and may extend over portions of the source region 12 and the drain region 14. The gate stack 20 may also be referred to as a stacked-gate or stack gate structure. The gate stack 20 includes a bottom oxide layer 22, a charge trapping dielectric charge storage layer 24 and a top oxide layer 26, as shown in FIG. 1. The gate stack 20 further includes a gate electrode 28 overlying the top oxide layer 26. The bottom oxide layer 22, the charge storage layer 24 and the top oxide layer 26 are sometimes referred to herein and in the art as an ONO structure. In conventional ONO structures, the "O" oxide layers are silicon dioxide, and the "N" charge storage layer is silicon nitride. In accordance with some embodiments of the present invention, the ONO structure may include in either or both "O" layers materials other than silicon dioxide, and "N" charge trapping dielectric charge storage materials other than silicon nitride, but the resulting structure will still be referred to herein as an ONO structure. For example, any one or more of the O layers or the N layer may comprise a high-K dielectric material, as described in more detail below. As schematically shown in FIG. 1, charges 34a and 34b may be stored in the charge storage layer 24, which acts as a charge or electron storage layer in the charge trapping dielectric flash memory device.

Referring still to FIG. 1, as shown therein, the gate stack 20 is covered by a thin oxide layer 30. The thin oxide layer 30 enhances isolation of the gate stack 20 and other elements of the device 10. The thin oxide layer 30 may have a thickness in the range from about 20 angstroms to about 150 angstroms, for example, and in one embodiment, about 100 angstroms. The thin oxide layer 30 may be formed or deposited by any conventionally known method for forming or depositing such a layer.

As shown in FIG. 1, on both sides of the gate stack 20 are gate stack spacers 32, which also may be referred to as isolation spacers or sidewall spacers. The gate stack spacers 32 comprise a reduced quantity or concentration of hydrogen, in accordance with the present invention. The gate stack spacers 32 are deposited by methods and from precursor materials described in more detail below, in accordance with the present invention.

In one embodiment, both the gate stack spacers 32 and the charge storage layer 24 comprise a reduced quantity or concentration of hydrogen. In the following description, the processes of the present invention are described with respect to the gate stack spacers 32, but the same processes are applicable, within the scope of the invention, to the charge storage layer 24.

Operation of the charge trapping dielectric flash memory device 10 shown in FIG. 1, is substantially the same as described in the background of the invention, except that providing reduced hydrogen content in the gate stack spacers 32 and, in one embodiment, in the charge storage layer 24, facilitates continued smooth and problem free processing and operation of the device in use. In the operation of the exemplary charge trapping dielectric flash memory 10, voltages are applied to the gate electrode 28 and as appropriate to the source/drain regions 12 and 14. The applied voltages cause electrical charge, e.g., one of charges 34a or 34b, to propagate from the channel region 18 into the charge storage layer 24. The charges 34a, 34b are localized in regions of the charge storage layer 24 in proximity to either the source/drain region 12, or the source/drain region 14, as shown in FIG. 1.

Those skilled in the art will recognize that for proper functioning of a charge trapping dielectric flash memory device, the electrical charges 34a, 34b should remain localized and isolated in the regions of the charge storage layer 24 to which it is initially introduced. Furthermore, it has become apparent that hydrogen contamination of the bottom oxide layer 22 and/or the top oxide layer 26 can cause non-ideal capacitance voltage characteristics and reduced channel conductance. The present inventors have discovered that problems such as non-ideal capacitance voltage and channel conductance can result from such hydrogen contamination. The inventors have further discovered that hydrogen in either or both of the gate stack spacers 32 and the charge storage layer 24 can migrate during subsequent processing or during use of the device, and thereby result in such problems.

In accordance with the invention, the gate stack spacers 32, and in one embodiment, the charge storage layer 24, are deposited by methods which result in the formation of materials having a reduced hydrogen content, relative to such structures formed by conventional methods. The improved device performance obtained by the present invention can be better understood following a description of a fabrication process carried out in accordance with the invention.

Figure 4:
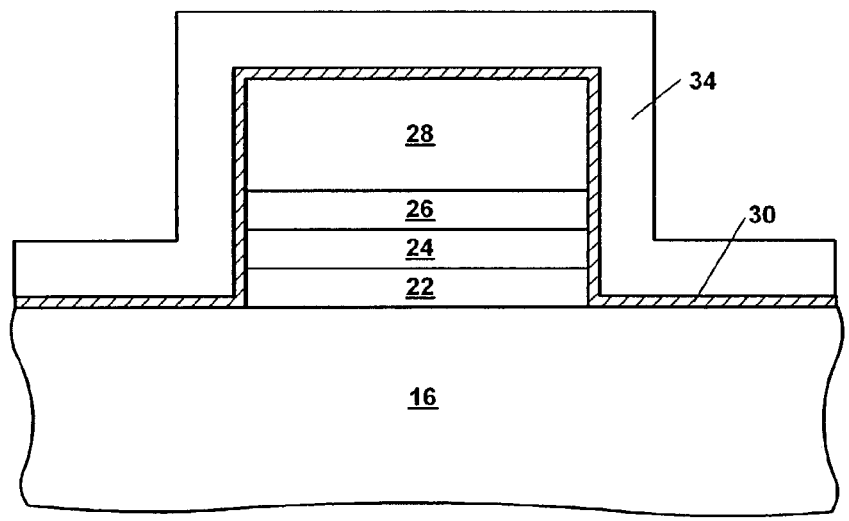
Figure 5:
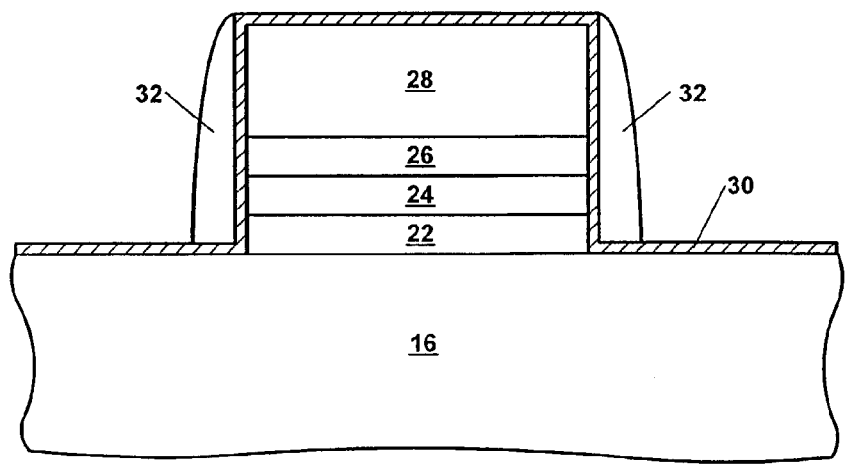
Figure 6:
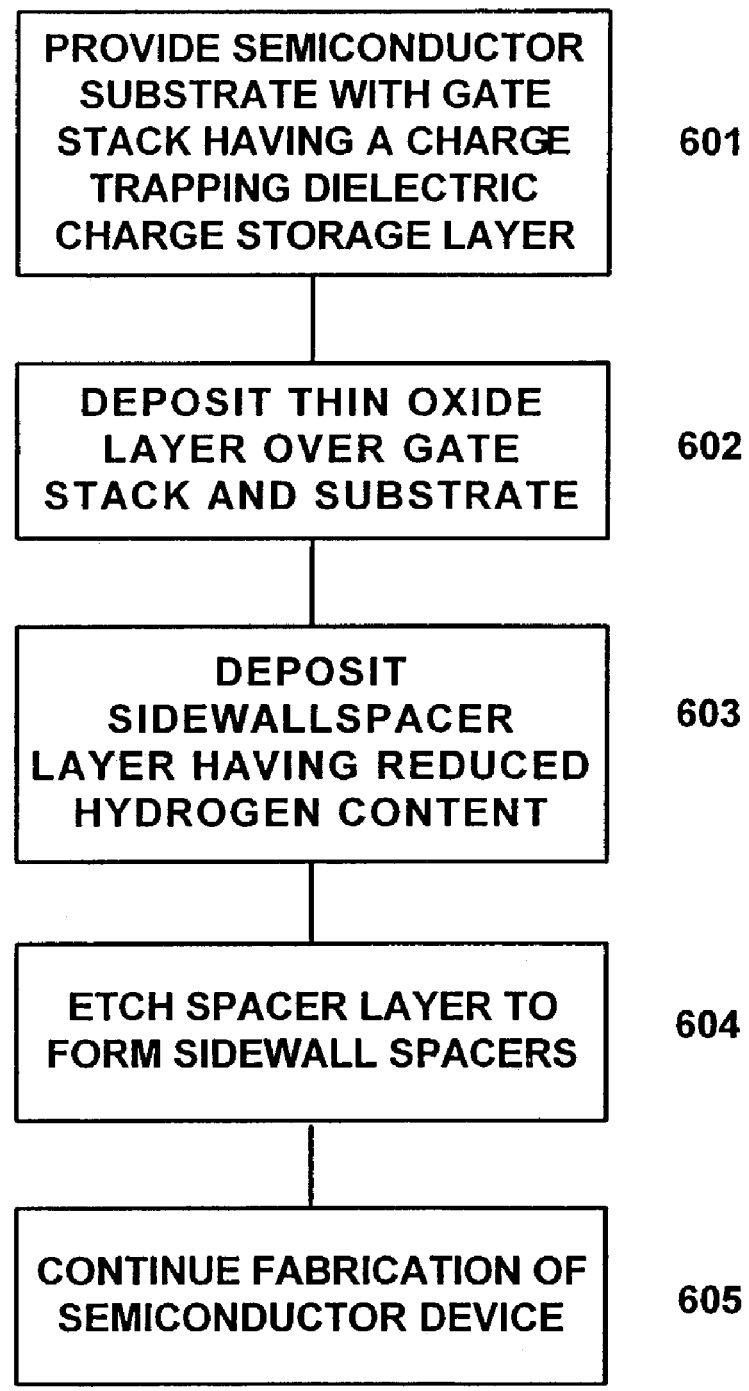
FIG. 6 is a schematic flow diagram generally illustrating steps of fabricating a device in accordance with an embodiment of the present invention.
Figure 7:
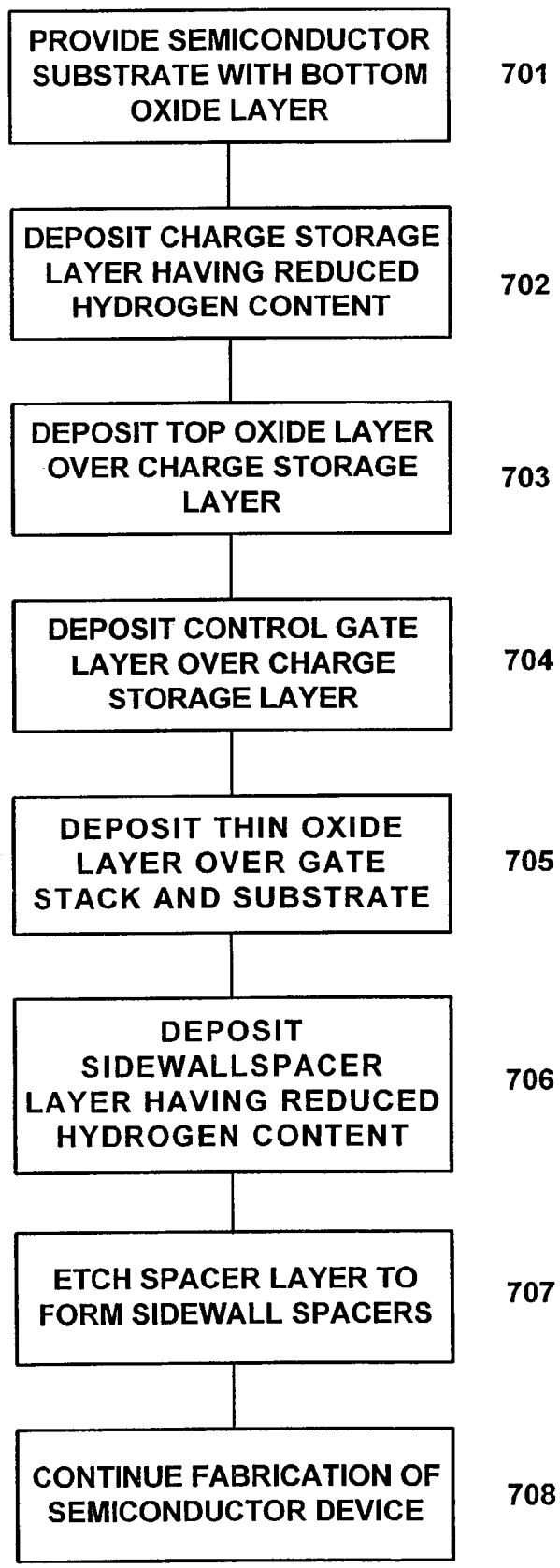
FIG. 7 is a schematic flow diagram generally illustrating steps of fabricating a device in accordance with another embodiment of the present invention.

A description of the present invention follows with reference to FIGS. 2–7. FIGS. 2–5 illustrate, in cross-section, process steps for the fabrication of a gate stack spacer, in accordance with the invention. FIGS. 6 and 7 are schematic flow diagrams generally illustrating steps of processes in accordance with two embodiments of the present invention.

Figure 2:
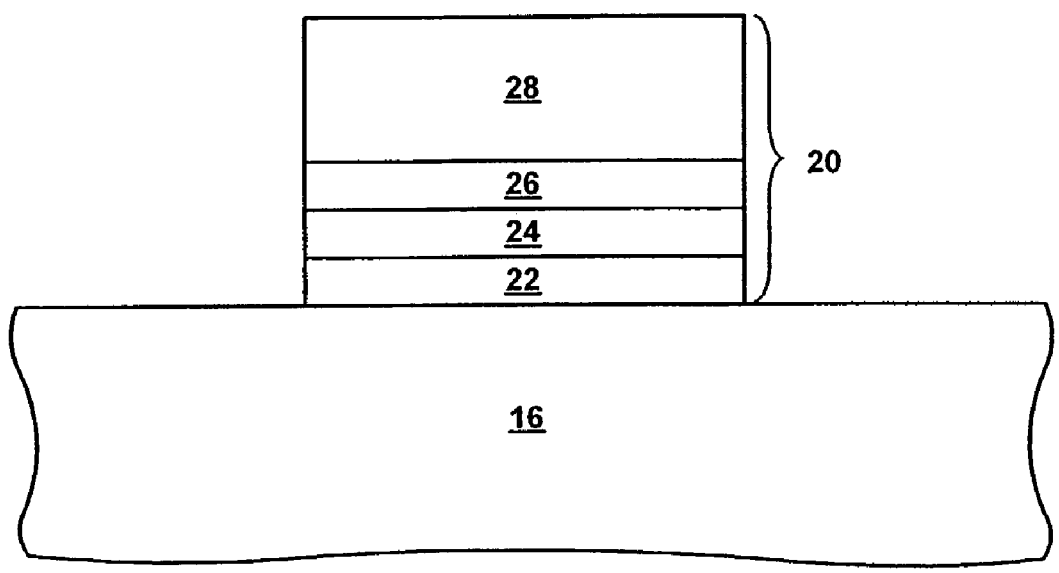
FIGS. 2–5 are schematic diagrams of steps in fabrication of the gate stack spacers, in accordance with the present invention.

In the first step of the present invention, shown schematically in FIG. 6 as step 601, a semiconductor substrate 16 having formed thereon a gate stack 20 is provided, such as is shown in FIG. 2. The semiconductor substrate can be any appropriately selected semiconductor substrate known in the art. For example, the semiconductor substrate can be a bulk silicon substrate, a silicon-on-insulator semiconductor substrate, a p-doped silicon substrate. Suitable semiconductor substrates include, for example, bulk silicon semiconductor substrates, silicon-on-insulator (SOI) semiconductor substrates, germanium-on-insulator (GOI), silicon-on-sapphire (SOS) semiconductor substrates, and semiconductor substrates formed of other materials known in the art. The present invention is not limited to any particular type of semiconductor substrate.

The gate stack 20 includes the bottom oxide layer 22, the charge storage layer 24 and the top oxide layer 26, together forming an ONO structure. The gate stack 20 further comprises the control gate electrode 28, located atop the ONO structure.

In one embodiment, the bottom oxide layer 22 is silicon dioxide. However, the bottom oxide layer 22 is not limited to silicon dioxide. In one embodiment, the bottom oxide layer 22 comprises a high-K dielectric material, a composite dielectric material, or a material substantially free of any high-K dielectric material. As used herein, the term "high-K dielectric material" refers to a dielectric material having a K of about 10 or higher. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 10 or more. In addition, the high-K dielectric materials include, for example, composite dielectric materials such as hafnium silicate, which has a K of about 14, and hafnium silicon oxynitride, which has a K of about 16, depending on the relative content of oxygen and nitrogen, and hafnium silicon nitride, which has a K of about 18.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. Suitable high-K dielectric materials also include tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide (LaAlO₃), lead titanate (PbTiO₃), strontium titanate (SrTiO₃), lead zirconate (PbZrO₃), tungsten oxide (WO₃), yttrium oxide (Y₂O₃), bismuth silicon oxide (Bi₄Si₂O₁₂), barium strontium titanate (BST) (Ba$_{1-x}$Sr$_x$TiO₃), PMN (Pb-Mg$_x$Nb$_{1-x}$O₃), PZT (PbZr$_x$Ti$_{1-x}$O₃), PZN (PbZn$_x$Nb$_{1-x}$O₃), and PST (PbSc$_x$Ta$_{1-x}$O₃). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate can be used in the present invention. Other high-K dielectric materials known in the art, including, for example binary and ternary oxides having K values of about 10 or higher, also may be used in the present invention.

As used herein, the term "composite dielectric material" refers to a dielectric material comprising the elements of at least two other dielectric materials. A composite dielectric material generally has a K value of about 10 or higher, as defined above for a high-K dielectric material. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide (Hf$_x$Zr$_{1-x}$O₂, where x ranges between 0 and 1), hafnium silicate (HfSiO₄), hafnium aluminate (HfAl₂O₅) or a hafnium mixed-aluminate/silicate, HfO₂/SiO₂/Al₂O₃, which may have a formula such as Hf₂Si₂Al₂O₁₁. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than that of silicon dioxide may be suitable. For example, the mixed-metal oxide, metal silicate, metal aluminate or metal mixed-aluminate/silicate is suitably one which substantially does not react with silicon (or polysilicon or polysilicon-germanium) at temperatures of about 600–800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

The bottom oxide layer 22 may be formed or deposited by any appropriate method known in the art. For example, the bottom oxide layer 22 can be formed by oxidation of the surface of the semiconductor substrate 16, e.g., by thermal oxidation, ISSG oxidation, steam oxidation or RTO. The bottom oxide layer 22 can also be formed by a deposition process, such as a CVD process. Exemplary CVD processes include, e.g., RTCVD, LPCVD, PECVD, ALD (ALCVD), PLD, MLD or MOCVD. The CVD method may be any appropriate CVD method known in the art. The bottom oxide layer 22 may be deposited by any other known suitable method, such as by a sputter deposition, or other vapor deposition. The present invention is not limited to any particular method for forming the bottom oxide layer 22.

The bottom oxide layer 22 is formed to have a thickness of from about 20 to about 500 angstroms. In one embodiment, the bottom oxide layer 22 has a thickness in a range from about 50 angstroms to about 200 angstroms, and in another embodiment, about 100 angstroms. As will be recognized, the thickness of the bottom oxide layer 22 may vary from these values.

Here and throughout the specification and claims, the limits of the disclosed ranges and ratios may be combined. Thus, for example, it is intended that the foregoing disclosed thickness ranges also include ranges from, e.g., about 20 angstroms to about 200 angstroms, and from about 50 angstroms to about 500 angstroms, although these ranges are not explicitly set forth.

Above the bottom oxide layer 22 is the charge trapping dielectric charge storage layer 24. As noted above, the charge storage layer 24 may comprise silicon nitride or other known charge trapping dielectric materials, such as a suitable high-K dielectric material. Any of the high-K dielectric materials disclosed above with respect to the bottom oxide layer 22 may be used, as appropriate, for the charge storage layer 24. Thus, in one embodiment, the charge storage layer 24 comprises silicon nitride. In another embodiment, the charge storage layer 24 comprises a suitable high-K dielectric material. In another embodiment, the charge storage layer 24 comprises both a high-K dielectric material and a standard-K dielectric material, such as silicon nitride. In one embodiment, the layer 24 comprises a composite dielectric material, which comprises a composite or a reaction product of two or more dielectric materials, one of which is a high-K dielectric material and the other of which may be a standard-K dielectric material such as silicon nitride. The charge storage layer 24 may be deposited by any suitable method such as, for example, the CVD methods mentioned above, or by other suitable method, such as a sputter or other vapor deposition method. The present invention is not limited to any particular method of forming the charge storage layer 24, except in the following embodiment:

In one embodiment, the charge storage layer 24 comprises silicon nitride and is deposited by one of the methods described below with respect to formation of the spacer layer 34 from which the gate stack spacers 32 are formed, thus providing an embodiment in which the charge storage layer 32 includes a reduced hydrogen content, relative to a conventional charge storage layer. Any of the methods and materials described below with respect to deposition of the spacer layer 34 may be applied to formation of this embodiment of the charge storage layer 24. In this embodiment, both the charge storage layer 24 and the gate stack spacer 32 comprise a reduced hydrogen content relative to a hydrogen content of a conventional charge storage material and of a conventional spacer material.

Above the charge storage layer 24 is a top oxide layer 26. The top oxide layer 26 may comprise any of the materials disclosed above for the bottom oxide layer 22. For example, the top oxide layer 26 may comprise silicon dioxide, a high-K dielectric material or a composite dielectric material, as defined herein.

The top oxide layer 26 may be deposited by any of the methods disclosed above for the bottom oxide layer 22. Thus, in one embodiment, the top oxide layer 26 is formed by an HTO deposition, such as the RTCVD or LPCVD methods described above. In one embodiment, the top oxide layer 26 is deposited by another suitable method, such as PECVD, ALD (ALCVD), PLD, MLD or MOCVD. The CVD method may be any appropriate CVD method known in the art.

In one embodiment, the top oxide layer 26 is formed by ISSG oxidation of a part of the upper surface of the charge storage layer 24, when the charge storage layer material comprises silicon in an oxidizable form, such as silicon nitride. Methods of ISSG oxidation are known in the art.

In one embodiment, in which the deposition of the silicon nitride charge storage layer 24 is carried out by RTCVD in the RTP apparatus, at the completion of the deposition, when the cool-down step has reduced the temperature to about 400 to about 500° C., the apparatus is converted for an ISSG oxidation process without removing the wafer from the apparatus, and without exposing the wafer to the outside atmosphere. Thus, these steps in the fabrication of the flash memory device may be carried out sequentially in a single apparatus, without removing the wafer from the apparatus between the charge storage layer 24 formation steps and the top oxide layer 26 formation steps.

Above the layers comprising the ONO structure, a control gate electrode layer 28 is formed on the top oxide layer 26. The gate stack structure 20 shown in FIG. 1 is completed by the layer 28 overlying the top oxide layer 26. The layer forming a control gate electrode 28 may comprise any material known in the art for such use. For example, the control gate electrode layer 28 may comprise polysilicon, polysilicon-germanium, a metal silicide, a metal, or any other suitable material known in the art.

Following formation of the layers 22, 24, 26 and 28 of which the gate stack 20 is comprised, a lithographic patterning and etching process may then be carried out to define the gate stack 20 structure shown in FIG. 2. At this point, a semiconductor substrate having formed thereon a gate stack comprising a charge trapping dielectric charge storage layer and a control gate electrode overlying the charge trapping dielectric charge storage layer has been provided, such as shown in FIG. 2, step 601 is complete, and fabrication of the flash memory device according to the present invention may proceed to step 602.

Figure 3:
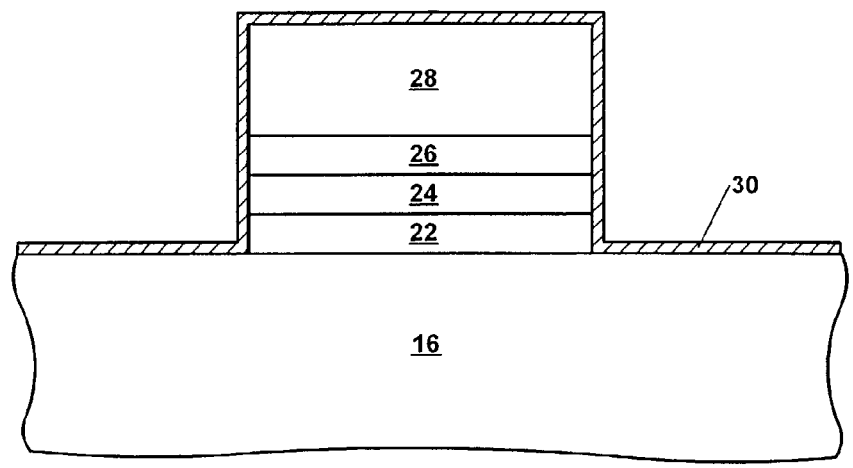

In the next step of the process of the present invention, shown schematically as step 602 in FIG. 6, a thin oxide layer 30 is formed over the gate stack 20 and the remainder of the semiconductor substrate not covered by the gate stack 20, such as shown in FIG. 3. The thin oxide layer 30 may be formed by any appropriate process, such as simple oxidation of the surfaces of the substrate 16 and gate stack 20 or deposition of an oxide thereover. The thin oxide layer 30 in one embodiment comprises silicon dioxide. As noted above, in one embodiment, the thin oxide layer 30 may have a thickness from about 20 angstroms to about 100 angstroms.

In the next step of the process of the present invention, shown schematically as step 603 in FIG. 6, a spacer layer 34 is deposited over the thin oxide layer 30, such as shown in FIG. 4. In accordance with the present invention, the spacer layer 34 comprises a spacer material having a reduced hydrogen content relative to a hydrogen content of a conventional spacer material. The reduced hydrogen content can be obtained by any of several procedures including reducing hydrogen content of precursor materials and taking steps to remove hydrogen from the reaction mixture from which the spacer material is formed.

In one embodiment, the reduced hydrogen content is achieved by depositing the spacer layer 34 using hydrogen-free precursor materials or precursors with low or reduced hydrogen content. Hydrogen-free precursors include, for example, tetrachlorosilane (TCS, $SiCl_4$), plasma-generated reactive nitrogen, $N_2O$ and atomic layer deposition of nitride, etc. Use of hydrogen-free precursors avoids the presence of hydrogen in the reaction mixture, thereby preventing incorporation of such hydrogen into the spacer material formed by the reaction. Precursors having low or reduced hydrogen content include dichlorosilane (DCS, $SiH_2Cl_2$). Reduced hydrogen content is relative to the conventional silicon source, silane ($SiH_4$). Use of reduced-hydrogen precursors reduces the amount of hydrogen in the reaction mixture and available for possible incorporation into the spacer material of the nascent spacer layer 34, thereby reducing incorporation of such hydrogen into the spacer material formed by the reaction.

In one embodiment, the reduced hydrogen content is achieved by depositing a spacer material comprising silicon-rich silicon nitride. Silicon-rich silicon nitride has a super-stoichiometric silicon content. The chemical formula can be expressed as $Si_xN_y$, wherein the ratio of x/y is greater than 0.75. As is known, stoichiometric silicon nitride has a chemical formula $Si_3N_4$, whereby the ratio of x/y=0.75. The process of forming silicon-rich silicon nitride imparts excess silicon to the dielectric material, resulting in a reduced hydrogen content. Silicon-rich silicon nitride may be deposited, for example, by providing a limited quantity of ammonia, $NH_3$, to the reaction chamber in a CVD deposition using TCS and ammonia to deposit silicon nitride.

In one embodiment, the reduced hydrogen content is achieved by depositing a spacer material comprising silicon oxynitride, wherein the silicon oxynitride comprises at least about 5 atomic percent oxygen. In one embodiment, the silicon oxynitride comprises up to about 20 atomic percent oxygen. As is known in the art, silicon oxynitride may contain a wide range of oxygen content. In this embodiment, the oxygen content is generally about 5 atomic percent or greater. Silicon oxynitride has a general formula $Si_xN_yO_z$, in which the relative levels of x, y and z may vary widely depending on formation conditions and subsequent treatments. Therefore, silicon oxynitride is often referred to simply as SiON. In this embodiment, the silicon oxynitride has an oxygen content of at least about 5 atomic percent oxygen. Although conventional forms of SiON often contain hydrogen, in accordance with one embodiment of the present invention, the SiON has a reduced level of hydrogen. In another embodiment, the SiON of the present invention is substantially free of hydrogen.

In one embodiment, the reduced hydrogen content is achieved by depositing the spacer layer 34 by ALD, atomic layer deposition. As is known, ALD proceeds stepwise, by applying first a monolayer of a first precursor material, evacuating the deposition chamber of the first precursor material, introducing a second precursor material which reacts with the first precursor to form a single layer of the product sought, thus the name "atomic layer" deposition. Due to the tightly controlled conditions, the layers are quite pure and the atomic layer of which the spacer layer 34 is comprised contains a low level of hydrogen contamination. As will be understood, in order to obtain a sufficient thickness of the spacer layer 34, the ALD will have to be repeated a number of times. For example, the typical thickness of an ALD layer of silicon nitride is approximately 3–4 angstroms. To obtain an exemplary spacer layer thickness of 50 angstroms, the ALD would have to be repeated, or cycled, from about 12 to about 17 times.

In one embodiment, the reduced hydrogen content is achieved by depositing the spacer material comprising silicon nitride, in which the depositing step is carried out by use of high temperature LPCVD. High temperature LPCVD may be used to deposit a layer comprising silicon nitride at temperatures in the range of about 700° C. to about 800° C., in which the silicon nitride has a reduced hydrogen content. High temperature LPCVD provides an excellent silicon nitride layer having a hydrogen content less than about 2 atomic percent, and in one embodiment, less than about 1.5 atomic percent, and in another embodiment, less than about 1 atomic percent.

In another embodiment, the reduced hydrogen content is achieved by depositing the spacer material comprising silicon nitride, in which the depositing step is carried out in the presence of a small quantity of oxygen. In one embodiment, sufficient oxygen is present in the silicon nitride deposition step to remove excess hydrogen, but the quantity of oxygen is such that the silicon nitride contains very little of the oxygen. In one embodiment, the silicon nitride formed by this step includes from about 0.1 atomic percent to about 5 atomic percent oxygen. In one embodiment, the silicon nitride formed by this step includes from about 0.5 atomic percent to about 5 atomic percent oxygen. In another embodiment, the silicon nitride comprises from about 1 atomic percent to about 3 atomic percent oxygen, and in another embodiment, the silicon nitride comprises less than about 1 atomic percent oxygen. The amount of oxygen in the silicon nitride depends on the amount of oxygen-containing precursor used, e.g., $N_2O$, in the deposition of the silicon nitride. This embodiment may be likened to silicon nitride containing a small or doping amount of oxygen, as opposed to what is known as silicon oxynitride, which is considered to contain a higher oxygen content.

In this embodiment, the silicon nitride is deposited by methods similar to conventional methods, except that a controlled, small quantity of oxygen is included with the reactants, in order to react with any excess hydrogen. In a conventional process for depositing silicon nitride, the precursor materials may include, for example silane and ammonia. Both of these precursor materials include hydrogen, but the hydrogen is not a desired part of the silicon nitride. Thus, in order to avoid its inclusion in the silicon nitride spacer layer 34, the hydrogen needs to be removed from the reaction mixture. Due to the reactivity of oxygen and hydrogen, providing oxygen to the reaction chamber in a quantity sufficient to react with a substantial portion of the hydrogen allows formation of a silicon nitride containing a reduced content of hydrogen, while still avoiding a higher content of oxygen. Thus, in one embodiment, the hydrogen content of the silicon nitride is reduced, and the oxygen content is maintained at less than about 5 atomic percent. In another embodiment, the oxygen content of the silicon nitride is maintained at least than about 3 atomic percent, and in another embodiment, less than about 2 atomic percent.

The reduced hydrogen content of the spacer layer 34, as used herein, means that the hydrogen content of the spacer material is less than the hydrogen content of a conventional gate stack spacer material. In one embodiment, the spacer material according to the present invention comprises a hydrogen content of about 2 atomic percent or less, while the hydrogen content of a conventional gate stack spacer material is substantially greater than 2 atomic percent. In some conventional spacer materials, the hydrogen content may range from about 3 atomic percent hydrogen to about 30 atomic percent, and in other materials, from about 5 atomic percent hydrogen to about 20 atomic percent, and in others from about 5 atomic percent to about 10 atomic percent hydrogen. In accordance with the present invention, the spacer layer 34 may be formed with a substantially reduced hydrogen content in the spacer material, i.e., hydrogen at about 2 atomic percent or less, and in one embodiment, hydrogen at about 1 atomic percent or less, or in another embodiment, hydrogen at about 0.5 atomic percent or less. In one embodiment, the spacer material comprises a hydrogen content in the range from about 0.1 atomic percent to about 0.5 atomic percent. In one embodiment, the spacer material comprises a hydrogen content less than about 0.1 atomic percent. In one embodiment, hydrogen is substantially not detectable in the spacer material in the spacer layer 34, when FTIR is used to analyze hydrogen content.

In one embodiment, hydrogen substantially does not migrate from the gate stack spacer 32 or the spacer layer 34 having a reduced hydrogen content into the gate stack 20 during subsequent processing or in use. Thus, in this embodiment, whatever the absolute hydrogen content, the hydrogen content of the spacer layer 34 is reduced to a level such that substantially no hydrogen migrates from the spacer layer 34 or from the gate stack spacer 32 during subsequent processing in the fabrication of the device, or during subsequent use of the device by an end user. "Substantially no hydrogen migrates" means that no, or very little, if any, hydrogen migrates, and any hydrogen that does migrate is either not detectable or has no adverse effect on operation of the flash memory device.

Following deposition of the spacer layer 34, in the next step of the process in accordance with an embodiment of the present invention shown in FIG. 6 as step 604, an anisotropic etch process is applied to remove the spacer material from the horizontal surfaces, but which leaves the gate stack spacers 32 on the vertical (or substantially vertical, depending on the etch process) sides of the gate stack 20, as shown in FIGS. 5 and 1. In this step, conventional etching processes may be used, with the proviso that the methods be carried out in a manner which does not result in addition of hydrogen to the remaining gate stack spacers 32. In one exemplary embodiment, reactive ion etching is used. In another exemplary embodiment, a dry plasma etch technique is used. The gate stack spacers 32 are thus formed on either side of the gate stack 20, as shown in FIGS. 5 and 1.

Upon completion of step 604, as shown in FIG. 6, fabrication of the semiconductor device continues, as shown in step 605 of FIG. 6.

As noted above, in one embodiment, the charge storage layer 24 is formed of a material comprising a reduced hydrogen content, as a result of which, a flash memory device is obtained having both a charge storage layer 24 and gate stack spacers 32 having a reduced hydrogen content. In this embodiment, the charge storage layer 24 may be fabricated by any of the methods described above with respect to fabrication of the gate stack spacer 32. Thus, in this embodiment, the present invention includes a process for fabricating a charge trapping dielectric flash memory device including both a charge storage layer including a charge trapping dielectric material having a reduced hydrogen content relative to a hydrogen content of a conventional charge trapping dielectric storage layer and a spacer layer including a spacer material having a reduced hydrogen content relative to a hydrogen content of a conventional spacer material. As a result of this embodiment, hydrogen substantially does not migrate either from the gate stack spacers 32, or from the charge storage layer 24, into the gate stack 20 (and particularly not into the bottom oxide layer 22) during subsequent processing or in use.

FIG. 7 is a schematic flow diagram generally illustrating steps of fabricating a device in accordance with this embodiment of the present invention. The steps of FIG. 7 are substantially the same as described above, except that, as noted, both the charge storage layer 24 and the gate stack spacers 32 comprise a material having a reduced hydrogen content.

In the process depicted schematically in FIG. 7, the first step is step 701, in which a semiconductor substrate 16 having a bottom oxide layer 22 thereon is provided. The semiconductor substrate 16 and the bottom oxide layer 22 may be any of those described above with respect to the embodiment provided in the first step of FIG. 6, and may be formed by any of the processes described above.

In the process depicted schematically in FIG. 7, the second step is step 702, in which a charge storage layer 24 is deposited on the bottom oxide layer 22, in which the charge storage layer has a reduced hydrogen content, as described above. Any of the methods described above for formation of the spacer layer 34 may be used in this step for deposition of the charge trapping dielectric material of which the charge storage layer 24 is formed, in accordance with this embodiment.

In the process depicted schematically in FIG. 7, the third step is step 703, in which a top oxide layer 26 is deposited on the charge storage layer 24. The top oxide layer 26 deposited in this step 703 may be the same as any of the top oxide layers and may be deposited by any of the methods described above with respect to the embodiment provided in the first step of FIG. 6.

In the process depicted schematically in FIG. 7, the fourth step is step 704, in which a control gate electrode layer 28 is deposited on the top oxide layer 26. The control gate electrode oxide layer 28 deposited in this step 704 may be the same as any of the control gate electrode layers described above with respect to the embodiment provided in the first step of FIG. 6, and may be deposited by any appropriate method.

At the completion of step 704, a semiconductor device including a gate stack formed thereon has been provided, similar to that provided in step 601 of the embodiment shown schematically in FIG. 6 and shown in FIG. 2, except that the charge storage layer 24 comprises a charge trapping dielectric material having a reduced hydrogen content relative to a conventional charge trapping dielectric material.

Thereafter, steps 705, 706, 707 and 708 correspond substantially to the steps 602, 603, 604 and 605 as described above with respect to the embodiment schematically depicted in FIG. 6, and these steps will not be repeated here. Thus, at the completion of step 706, a charge trapping dielectric flash memory device 10 including both a charge storage layer 24 including a charge trapping dielectric material having a reduced hydrogen content relative to a hydrogen content of a conventional charge trapping dielectric storage layer and a spacer layer 34 including a spacer material having a reduced hydrogen content relative to a hydrogen content of a conventional spacer material, such as shown in FIG. 4. This embodiment provides dual protection from hydrogen migration; by reducing the hydrogen content of both the charge storage layer and the gate stack spacers, this embodiment eliminates or reduces the possibility of any reduction of function of the bottom oxide layer in the flash memory device resulting from hydrogen migration into the bottom oxide layer.

There has been disclosed in accordance with the invention a process for fabricating an charge trapping dielectric charge storage flash memory device, for example for use in a MIRRORBIT™ device, that fully provides the advantages set forth above. Although described in terms of, and particularly applicable to, charge trapping dielectric charge storage flash memory devices, the present invention is broadly applicable to fabrication of any semiconductor device including a structure in which hydrogen content needs to be reduced to avoid migration of hydrogen to other parts of the device which may be sensitive to the presence of hydrogen.

INDUSTRIAL APPLICABILITY

The present invention provides a solution to various problems resulting from the presence of hydrogen in materials such as silicon nitride of which a gate stack spacer is formed. Thus, the present invention helps to eliminate or reduce problems resulting from hydrogen in the gate stack spacer structure used in charge trapping dielectric flash memory devices.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process for fabricating a charge trapping dielectric flash memory device comprising:
   providing a semiconductor substrate having formed thereon a bottom oxide layer;
   depositing on the bottom oxide layer a charge trapping dielectric charge storage layer, wherein the charge storage layer comprises a charge trapping dielectric material having a reduced hydrogen content relative to a hydrogen content of a conventional charge trapping dielectric storage layer;
   depositing on the charge storage layer a top oxide layer;
   depositing on the top oxide layer a control gate electrode layer, whereby a gate stack comprising the bottom oxide layer, the charge storage layer, the top oxide layer and the control gate electrode is provided;
   forming an oxide layer over at least the gate stack;
   depositing a spacer layer over the gate stack, wherein the spacer layer comprises a spacer material having a reduced hydrogen content relative to a hydrogen content of a conventional spacer material; and
   etching the spacer layer to form a gate stack spacer adjacent the gate stack,
   wherein hydrogen substantially does not migrate into the gate stack from either the gate stack spacer or from the charge storage layer, during subsequent processing or in use.

2. The process of claim 1, wherein the reduced hydrogen content is achieved by depositing the spacer material and the charge trapping dielectric material using hydrogen-free precursor materials, using atomic layer deposition, using high temperature LPCVD or using a combination of two or more of the foregoing.

3. The process of claim 1, wherein the reduced hydrogen content is achieved by the spacer material and the charge trapping dielectric material comprising silicon-rich silicon nitride.

4. The process of claim 1, wherein the reduced hydrogen content is achieved by the spacer material and the charge trapping dielectric material comprising silicon oxynitride, wherein the silicon oxynitride comprises at least about 5 atomic percent oxygen.

5. The process of claim 1, wherein the reduced hydrogen content is achieved by depositing the spacer material and the charge trapping dielectric material comprising silicon nitride, wherein the depositing step is carried out in the presence of oxygen.

6. The process of claim 5, wherein sufficient oxygen is present to remove excess hydrogen, but the silicon nitride comprises less than about 5 atomic percent oxygen.

7. The process of claim 1, wherein at least one of the spacer material and the charge trapping dielectric material comprises a hydrogen content of about 2 atomic percent or less, and the hydrogen content of a conventional spacer material or charge trapping dielectric material is substantially greater than 2 atomic percent.

8. The process of claim 7, wherein at least one of the spacer material and the charge trapping dielectric material comprises a hydrogen content in the range from about 0.1 atomic percent to about 0.5 atomic percent.

9. The process of claim 1, wherein hydrogen is substantially not detectable in at least one of the spacer material and the charge trapping dielectric material, when analyzed by FTIR.

10. A process for fabricating a charge trapping dielectric flash memory device comprising:
    providing a semiconductor substrate having formed thereon a bottom oxide layer;
    depositing on the bottom oxide layer a charge trapping dielectric charge storage layer, wherein the charge storage layer comprises a charge trapping dielectric material having a reduced hydrogen content relative to a hydrogen content of a conventional charge trapping dielectric storage layer;
    depositing on the charge storage layer a top oxide layer;
    depositing on the top oxide layer a control gate electrode layer, whereby a gate stack comprising the bottom oxide layer, the charge storage layer, the top oxide layer and the control gate electrode is provided;
    forming an oxide layer over at least the gate stack;
    depositing a spacer layer over the gate stack, wherein the spacer layer comprises a spacer material having a reduced hydrogen content relative to a hydrogen content of a conventional spacer material; and
    etching the spacer layer to form a gate stack spacer adjacent the gate stack,
    wherein hydrogen substantially does not migrate into the gate stack from either the gate stack spacer or from the charge storage layer, during subsequent processing or in use and both the spacer material and the charge trapping dielectric material comprise a hydrogen content of about 2 atomic percent or less, and the hydrogen content of a conventional spacer material or charge trapping dielectric material is substantially greater than 2 atomic percent.

11. The process of claim 10, wherein the reduced hydrogen content is achieved by depositing the spacer material and the charge trapping dielectric material using hydrogen-free precursor materials, using atomic layer deposition, using high temperature LPCVD or using a combination of two or more of the foregoing.

12. The process of claim 10, wherein the reduced hydrogen content is achieved by the spacer material and the charge trapping dielectric material comprising silicon-rich silicon nitride.

13. The process of claim 10, wherein the reduced hydrogen content is achieved by the spacer material and the charge trapping dielectric material comprising silicon oxynitride, wherein the silicon oxynitride comprises at least about 5 atomic percent oxygen.

14. The process of claim 10, wherein the reduced hydrogen content is achieved by depositing the spacer material and the charge trapping dielectric material comprising silicon nitride, wherein the depositing step is carried out in the presence of oxygen.

15. The process of claim 14, wherein sufficient oxygen is present to remove excess hydrogen, but the silicon nitride comprises less than about 5 atomic percent oxygen.

16. The process of claim 10, wherein at least one of the spacer material and the charge trapping dielectric material comprises a hydrogen content in the range from about 0.1 atomic percent to about 0.5 atomic percent.

17. The process of claim 10, wherein hydrogen is substantially not detectable in at least one of the spacer material and the charge trapping dielectric material, when analyzed by FTIR.

18. The process of claim 1 wherein at least one of the bottom oxide layer and the top oxide layer comprises a high-K dielectric material or a composite dielectric material.

19. The process of claim 10 wherein at least one of the bottom oxide layer and the top oxide layer comprises a high-K dielectric material or a composite dielectric material.

* * * * *